(12) United States Patent
Burdick

(10) Patent No.: US 6,758,686 B2
(45) Date of Patent: Jul. 6, 2004

(54) LOW CURRENT MINIMAL ALIGNMENT COMPRESSION CONTACT SYSTEM

(75) Inventor: Robert C. Burdick, Romulus, MI (US)

(73) Assignee: Alcoa Fujikura Limited, Franklin, TN (US)

( * ) Notice: Subject to any disclaimer, the term of this patent is extended or adjusted under 35 U.S.C. 154(b) by 196 days.

(21) Appl. No.: 10/173,280

(22) Filed: Jun. 18, 2002

(65) Prior Publication Data

US 2003/0232524 A1 Dec. 18, 2003

(51) Int. Cl.[7] .......................... H01R 4/58; H01R 12/00; H05K 1/00
(52) U.S. Cl. .......................................... 439/86; 439/67
(58) Field of Search ............................ 439/86, 67, 493, 439/66

(56) References Cited

U.S. PATENT DOCUMENTS

| | | | |
|---|---|---|---|
| 4,576,427 A | 3/1986 | Verbruggen | 339/61 M |
| 5,482,473 A | 1/1996 | Lord et al. | 439/67 |
| 5,777,855 A | 7/1998 | Yokajty | 361/803 |
| 5,954,536 A | 9/1999 | Fuerst et al. | 439/493 |
| 6,036,502 A * | 3/2000 | Neidich et al. | 439/67 |
| 6,064,217 A * | 5/2000 | Smith | 324/760 |
| 6,398,562 B1 * | 6/2002 | Butler et al. | 439/91 |
| 6,402,526 B1 * | 6/2002 | Schreiber et al. | 439/67 |

* cited by examiner

Primary Examiner—Chandrika Prasad
(74) Attorney, Agent, or Firm—Tracey D. Beiriger

(57) ABSTRACT

An electrical contact system including an elastomeric conductive material of specified shape and size, said conductive material exhibiting a first plurality of electrical contact locations. An electrical power supply connected to the conductive material and communicable with the first electrical contact locations. A like plurality of second electrical contacts are arranged in abutting and substantially two dimensional contact with respect to the first electrical contact locations, an electrically communicable conduit extends from the second contacts. The two dimensional electrical communication established between the abutting first and second contacts allows for a range of misalignment existing therebetween during low current (typically in a range of 1 mA–1A) transfer across the electrical contact system.

15 Claims, 6 Drawing Sheets

LOW CURRENT MINIMAL ALIGNMENT COMPRESSION CONTACT SYSTEM

FIELD OF THE INVENTION

The present invention relates generally to easy installation and low current electrical contact systems. More specifically, the present invention teaches a low current and minimal alignment compression contact system, of the type which in particular provides a low profile, easy to assemble electrical harness interconnect system incorporating such as low current conductive plasticized materials which allow for interconnection of flex circuit and traditional round wire or flex to flex interconnection.

BACKGROUND OF THE INVENTION

The present invention is well documented with examples of flex circuit connectors, as well as additional types of connectors for providing low insertion and extraction forces. In particular, existing electrical connection technology utilized for vehicle wire harness interconnects tend to occupy large volumes of space in a vehicle and require substantial depth to package the connectors as well as additional wire to allow for the assembly of the connectors.

It is also known that connectors in such low current applications are often larger than needed for the current required for the application. One known attempted solution to this problem has been the development of Self Docking Connection Systems (SDCS). These have been found to be bulky in nature because they are designed with tapered features which force the connectors into x and y axial alignment and as they mate in the z axis. Other necessary features include the connector's ability to float in both the x and y axis and these connection systems are also known to require an additional part or parts to provide self docking, thus driving up the weight, size and cost requirements of the system.

Other related applications are known in the art for incorporating a flex circuit into an electrical communication system and a first example of this is set forth in U.S. Pat. No. 5,482,473, issued to Lord et al. Lord teaches the provision of a flex circuit having thin film conductors encased between layers of insulative material, and including a proximal end with conductive contact pads exposed through one of the insulative layers.

In a preferred form, the proximal ends of the two flex circuits are assembled in face-to-face relation and compressed by a clamp fixture against opposite side faces of a compressible terminal block. The terminal block is formed from a resilient insulative elastomer such as silicone rubber with embedded conductive strips having opposite edges at the opposite side faces of the terminal block for electrically connecting aligned pairs of the contact pads on the two flex circuits. The exposed edges of the conductive strips are circumscribed by the insulative elastomer which engages the flex circuits with a footprint circumscribing the exposed contact pads, whereby the terminal block hermetically seals the interface between the conductive strips and the contact pads.

A further example of a connector for electrically interconnecting the conductors of a flat flexible circuit to the conductors of a complementary mating connecting device is illustrated in U.S. Pat. No. 5,954,536, issued to Fuerst et al. The connector includes a carrier on which the flexible circuit is positioned with the conductors of the circuit facing away from the carrier. A housing has an opening for receiving the carrier which is slidably mounted into the opening in the housing to a preliminary loading position for receiving the mating connecting device between the carrier and the housing. The carrier is pivotable from the preliminary loading position to a final connecting position whereat the conductors of the flat circuit are biased against the conductors on the mating connecting device.

U.S. Pat. No. 5,777,855, issued to Yokajty, teaches a method and apparatus for connecting flexible circuits to a printed circuit board wherein the device is integral with the flexible circuit and the printed circuit board, resulting in an improvement in the ease and efficiency of assembly. The printed circuit board includes a cut-out in a side edge thereof to yield an arcuate bearing rim located between a pair of opposing nocks. The circuit board further includes a plurality of solder pads adjacent the arcuate bearing rim.

The flexible circuit includes a pair of opposing notches located on each in a lateral edge of the flexible circuit, which also includes a plurality of solder pads proximate to the pair of opposing notches. The flexible circuit has a predetermined width at across the opposing notches which is substantially equal to the predetermined length of the arcuate bearing rim. The flex circuit is caused to bow such that it can be inserted into the cut-out so that the notches interlock with the nocks with the flexible circuit engaging the bearing rim to conform to the shape of the bearing rim and automatically align the solder pads of the printed circuit board with the solder pads of the flexible circuit. The electrical and mechanical connection is then completed by soldering.

SUMMARY OF THE INVENTION

The present invention teaches a low current and minimal alignment compression contact system, of the type which in particular provides a low profile, easy to assemble electrical harness interconnect system. The minimal alignment compression contact system further incorporates such as a low current conductive plasticized material which allows for interconnection of flex circuit and traditional round wire or flex to flex interconnection.

The elastomer conductor technology facilitates the conduction of low current, such as in automotive electrical circuits, and requires only minimal alignment due to the target circuit conductor being large enough in area to accommodate misalignments in both two dimensional x and y axial directions. In the various preferred applications, the connection system establishes electrical communication by sandwiching the conductive elastomer between two electrical conductors and a three dimensional z axis tolerance is further provided by a second non-electrically conductive elastomer (such as a foam gasket) which backs up one or both stationary electrical conductors that sandwich the elastomeric conductor.

In a first preferred embodiment, the elastomeric conductive material is constructed as a substantially planar shaped tray and with a first plurality of electrical contacts in the form of disk shaped (or button shaped) portions, and which project in spaced apart fashion from a selected face of the tray. The entire material content of the tray may be constructed of the elastomeric conductive material (e.g., also considered to include thermoplastic, silicone, and rubberized materials) or, alternatively, the elastomeric material may include both conductive and non-conductive portions. Also, a plurality of electrical contact lines (typically two apiece) extend to and from each of the individual spaced apart disk portions and communicate with a bussed electrical contact extending such as along an edge of the tray.

A second plurality of electrical contacts are provided for abuttingly engaging, in electrically communicable and two dimensionally aligning fashion, the first plurality of disk shaped contacts. In one particular variant, the second plurality of contacts is provided as a further plurality of disk shaped portions (or such as further metallic rivet head portions), each of which being abuttingly contacted with an associated first disk shaped contact and so that, given minor misalignments along both x and y axes associated with the two dimensional contact, the low current electrical communication will be maintained between the associated contacts.

In a further preferred variant, the second electrical contact is reconfigured as a substantially thin, planar shaped and flexible circuit sheet. The flex sheet includes a plurality of spaced apart contact locations which abuttingly contact the associated disk shaped portions associated with the planar shaped tray.

Additional embodiments include the provision of one or more puck shaped inserts which engage in communicable fashion with the electrical contact locations on the flex sheet. The puck inserts are likewise conducted of the elastomeric conductive material and may further be seated, in plural arrangement, within spaced apart recesses defined within a three dimensional connector body to which is connected an electrical input line.

BRIEF DESCRIPTION OF THE DRAWINGS

Reference will now be made to the attached drawings, when read in combination with the following detailed description, wherein like reference numerals refer to like parts throughout the several views, and in which.

DETAILED DESCRIPTION OF PREFERRED EMBODIMENTS

Figure 1:
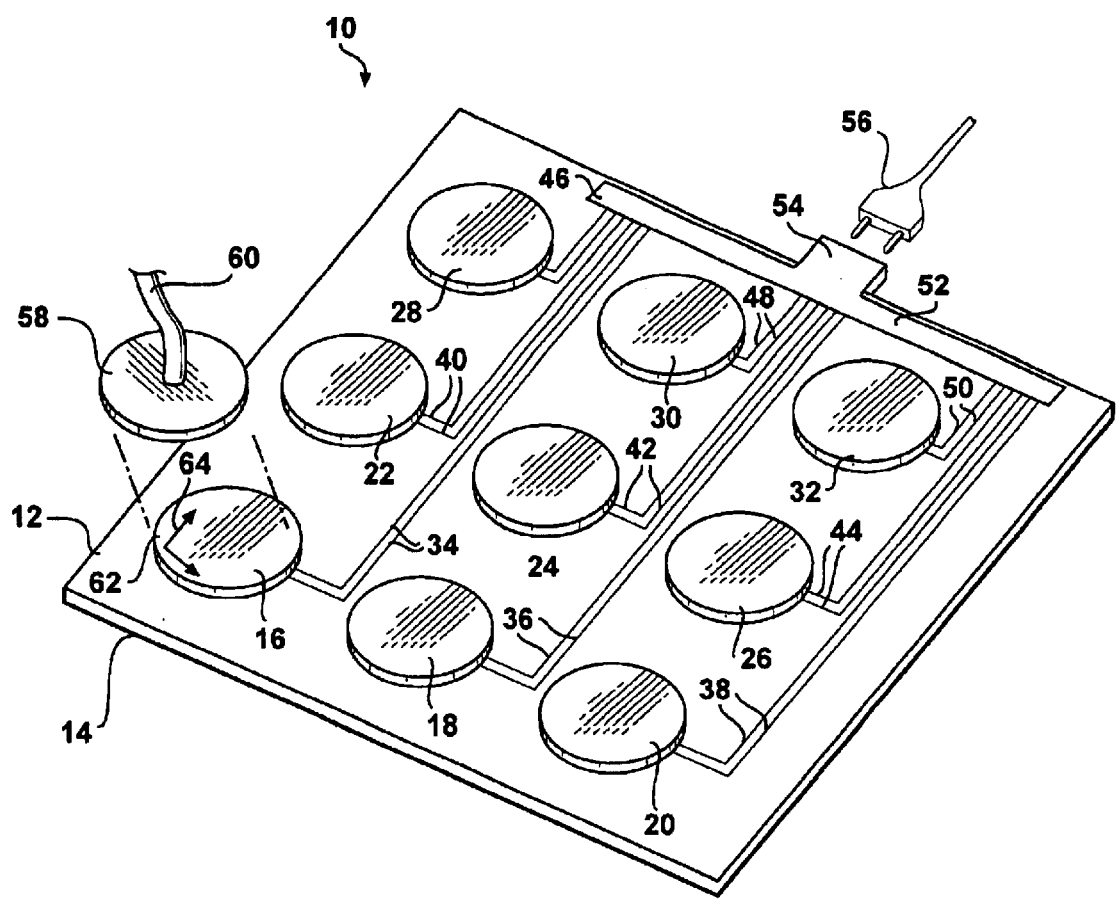
FIG. 1 is a perspective view of a first preferred variant of the present invention and illustrating a plurality of disk shaped portions associated with the low current minimal alignment compression contact system.

Referring now to FIG. 1, an electrical contact system is illustrated at 10 according to a first preferred embodiment of the present invention. As described previously, the present invention teaches a low current and minimal alignment compression contact system of the type which in particular provides a low profile, easy to assemble electrical harness interconnect system. The minimal alignment compression contact system further incorporates such as a low current conductive plasticized material which allows for interconnection of flex circuit and traditional round wire or flex to flex interconnection.

As also stated previously and as will be discussed further, the elastomer conductor technology facilitates the conduction of low current, such as in automotive electrical circuits, and requires only minimal alignment due to the target circuit conductor being large enough in area to accommodate misalignments in both two dimensional x and y axial directions. In the various preferred applications, the connection system establishes electrical communication by sandwiching the conductive elastomer between two electrical conductors and a three dimensional z axis tolerance is further provided by a second non-electrically conductive elastomer (such as a foam gasket) which backs up one or both stationary electrical conductors that sandwich the elastomeric conductor.

Referring again to FIG. 1, the electrical contact system 10 according to the first preferred embodiment includes a substantially planar shaped tray and having a first selected face 12 and a second selected face 14. In the preferred embodiment, the tray is constructed as a substantially thin and rectangular shaped item, however it is understood that the tray can exhibit any desired shape or size within the scope of the invention.

A plurality of first electrical contact points are illustrated at 16, 18, 20, 22, 24, 26, 28, 30 and 32 and each is configured as a substantially disk shaped portion. Each of the disk shaped portions 16–32 projects in spaced apart fashion from the first selected face 12 of the tray and further such that, upon viewing the reverse facing second side 14 as in FIG. 2, the disk portions are each substantially recessed on the reverse sides thereof.

Figure 2:
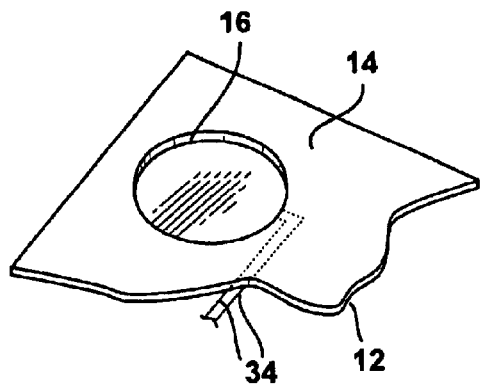
FIG. 2 is a partial view in perspective of a selected button portion associated with the alignment contact system, in an inverted position, and further illustrating electrical contact leads extending to and from the selected disk portion which is constructed of a low conductive plasticized material.

As also shown in FIGS. 1 and 2, a plurality of electrical contact lines (typically two apiece) extend to and from each of the individual spaced apart disk portions 16–32. In particular, individual pairs of contact lines are illustrated in FIG. 1 at 34, 36, 38, 40, 42, 44, 46, 48 and 50 and correspond with each of the disk shaped portions 16, 18, 20, 22, 24, 26, 28, 30 and 32, respectively. In the preferred application, the pairs of contact lines 34–50 communicate with a common bussed electrical contact 52, such as which further includes an input 54 extending from a selected edge of the tray and which may be engaged by an appropriately configured input connector 56.

It is also known that the elastomeric construction of the tray may include both conductive and non-conductive portions. In the preferred application, the conductive portions are associated with the raised surfaces of the disk shaped elements, while the remaining body of the tray is constructed of a non-conductive elastomer and through which extends each of the pairs of electrical contact lines 34–50. It is however understood that other potential applications of conductive elastomer technology can be incorporated and without departing from the scope of the invention. It is also envisioned that the elastomer construction can contemplate provision of materials such as conductive plastics, silicone and rubberized materials within the scope of the invention.

Figure 3:
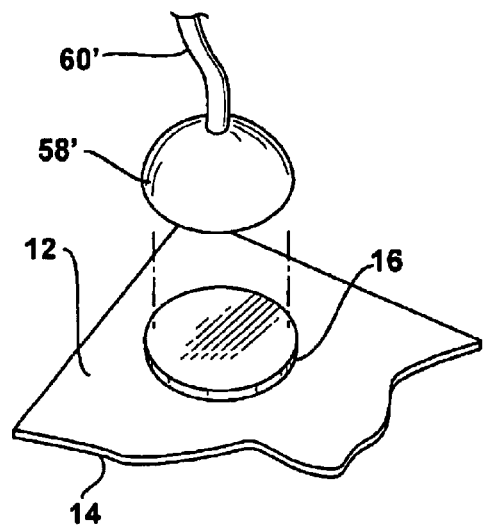
FIG. 3 is a partial view of a selected button portion associated with the alignment contact system of FIG. 1 and illustrating an alternate variant of minimally aligning and attachable contact for use with the selected button portion.

As also shown in FIG. 1, a second electrical contact is illustrated at 58 and is configured in one preferred variant as a likewise substantially disk shaped portion and which further includes an electrical line 60 extending from a reverse face thereof. An alternate variant of this arrangement is illustrated in FIG. 3 and in which the second electrical contact is configured as a metallic rivet head portion 58', again including an electrical line 60' extending therefrom. The opposing faces of the disk shaped and first 16 and opposing second 58 electrical contacts are arranged in abutting and adhering fashion, such as by fixing by adhesion (gluing) or some other suitable mechanical fashion, such as by example through ultrasonic welding, heat staking or the like, and so that some minimal degree of surface area contact is established between the opposing surfaces.

A feature of the present invention provides that, given the establishment of the minimal degree of surface area contact between each of the opposing disk shaped portions, the base requirements are met for establishing electrical current transfer for low current applications typically on the order of 1 mA (milli-Ampere) to 1 A (Ampere). Such low current applications are most notably present in certain vehicle display and sensor systems, and such as will be described in some further detail in reference to FIG. 9.

Also, and referencing again FIG. 1, the two dimensional contact established between the adhering disk shaped portions, and which by its nature does not require the provision of a z axis or three dimensional contact component, permits for a reasonable range of two dimensional misalignment (see x and y axes representations 62 and 64) during adhering contact of the respective disk portions. The advantage of this is that inherent misalignments can be accounted for in the assembly of the electrical contact system and, given their occurrence, will not render the system inoperable. Further, the ability to dispense with the requirement of a z axis insertion pin (this typically being associated with higher current requirement applications) renders the system more easy to assemble and maintain.

Figure 4:
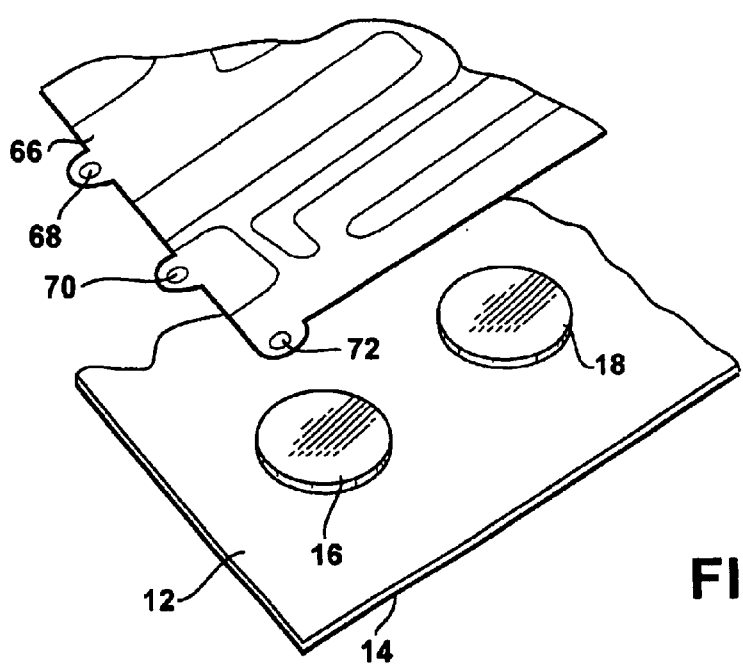
FIG. 4 is a further partial view in perspective and illustrating the manner in which a flex circuit is applied upon a face of minimal alignment and compression contacting system according to the present invention.

Referring to FIG. 4, a further variant of the tray embodiment of FIGS. 1–3 contemplates substituting the individual and second plurality of disk shaped elements (see again examples of FIGS. 1 and 3) with the provision of a substantially thin, planar shaped and flexible circuit sheet 66. The flex sheet 66, by itself known in the relevant art, includes suitable conductive patterns formed thereupon. Upon adheringly engaging the flex sheet 66 over the face 12 of the tray, such as by securing the edge locations 68, 70 and 72 to specified underside locations of the tray, specified and individual contact locations (typically associated with given solder points arranged on the sheet) are again in abutting and adhering contact with the selected disk shaped portions (see again for example at 16 and 18) and can provide the same accommodation for misalignments therebetween without sacrificing the electrical contact established.

Figure 5:
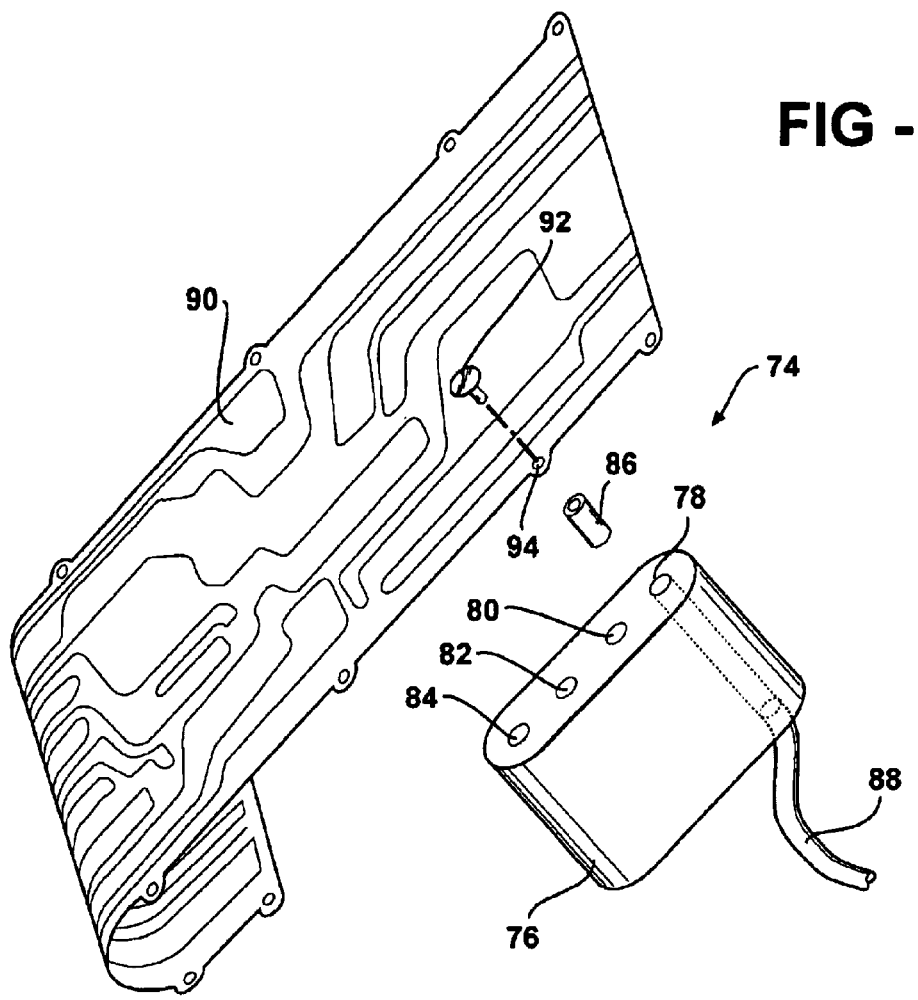
FIG. 5 is a perspective view of a further preferred embodiment of the present invention and in which a puck shaped insert is utilized to interconnect the flex circuit with an associated wire and connector element.

Referring now to FIG. 5, a further embodiment of the electrical contact system is shown generally at 74 and in which the conductive material includes a three dimensional shaped body 76. The body 76 in this instance is in substitution of the tray 10 illustrated and described in the first preferred embodiment and further includes a plurality of spaced apart recesses 78, 80, 82 and 84 defined within a selected face of the body.

Each recess receives, in inserting fashion, a cylindrically shaped puck insert, see by example at 86 in relation to selected recess 78. The puck insert 86 is constructed of the suitable conductive elastomer material and in order to conduct low current electrical input, from an input line 88 to the body 76, through to a further specified location of a flex circuit sheet 90. In this fashion, the body 76 is secured to the flex sheet 90, such through the provision of a mechanical rivet fastener 92 and so that the selected elastomer puck insert 86 associated with the body 76 is electrically communicated with the selected location 94 of the flex circuit sheet 90.

Figure 6:
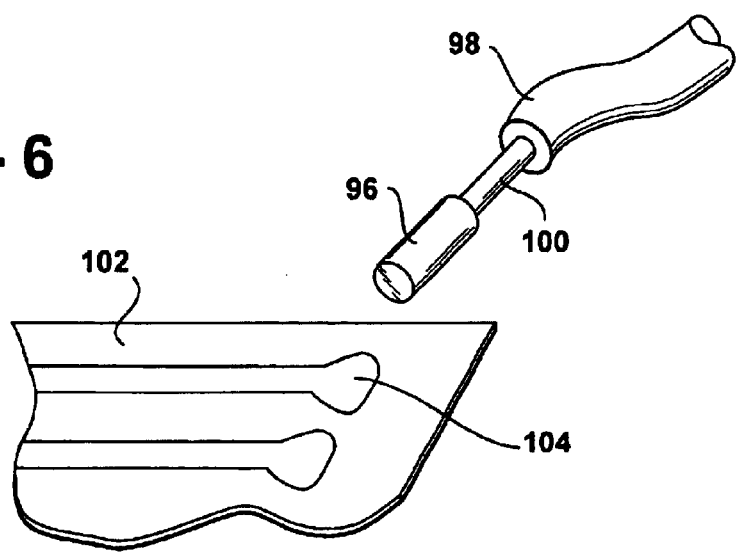
FIG. 6 is a further variant in partial perspective of the embodiment of FIG. 5 and which illustrates a farther variant of a low current conductive and puck shaped insert extending from an end of a conventional wire and which engages a location of a flex circuit.

Referring further to FIG. 6, an alternate variant contemplates the provision of a single elastomeric conductive and puck shaped insert 96 extending from a wire connector 98 and in particular a terminating end 100 thereof. The puck insert 96 operates in substantially the same fashion as described in reference to the description of FIG. 5, and, in the current instance, engages a flex circuit sheet 102 so that a given location 104 thereof is established in electrical contact with the insert 96. As in the earlier described variant, the puck insert 96 can be secured through a variety of mechanical or chemical means and such that sufficient electrical contact is maintained therebetween the guarantee the needed low current transfer.

Figure 7:
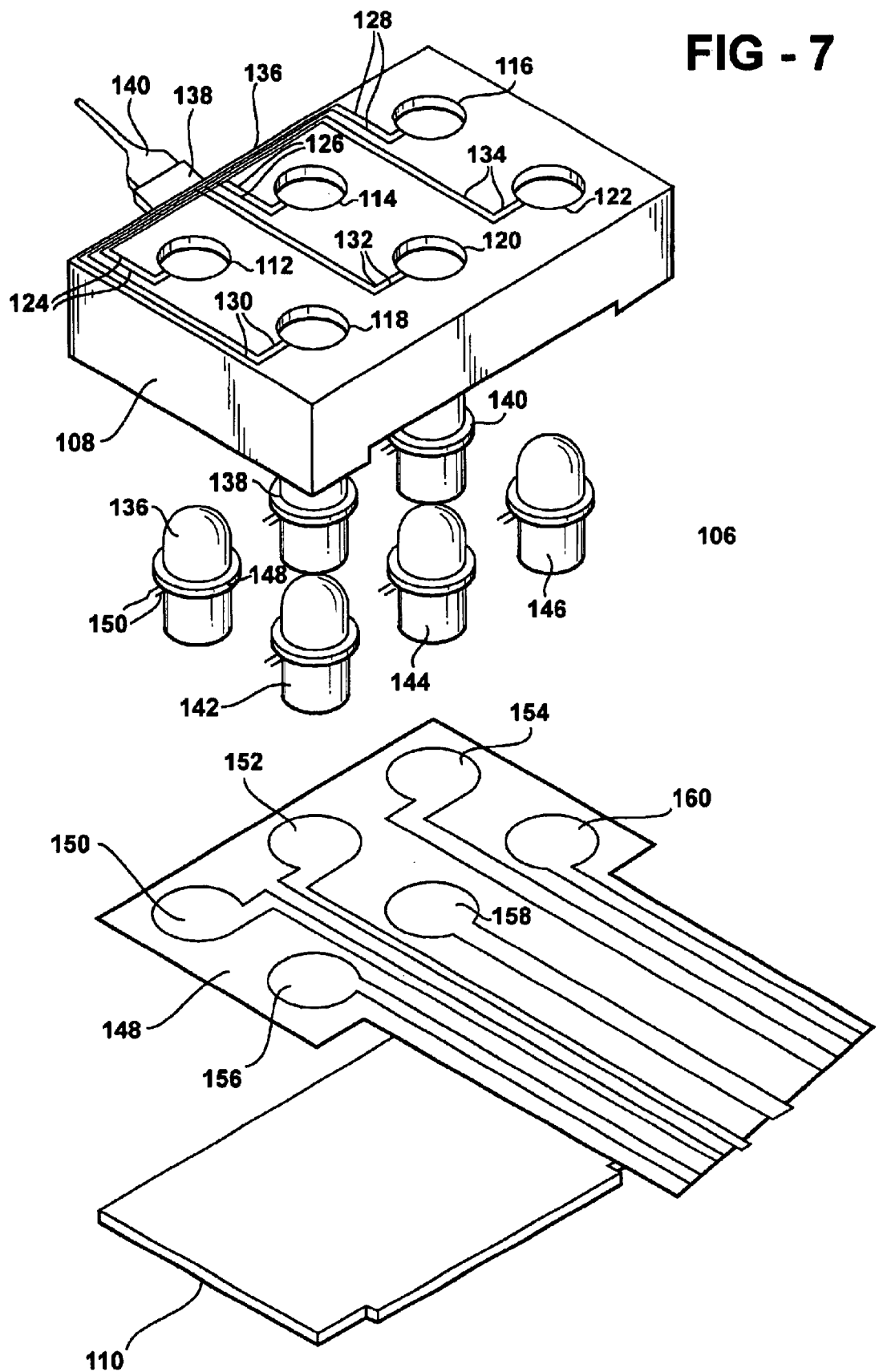
FIG. 7 is an exploded view in perspective of a yet additional preferred embodiment of the present invention and illustrating a plurality of individual puck shaped inserts in use with an assembleable tray and with a flex circuit sheet sandwiched therebetween.
Figure 8:
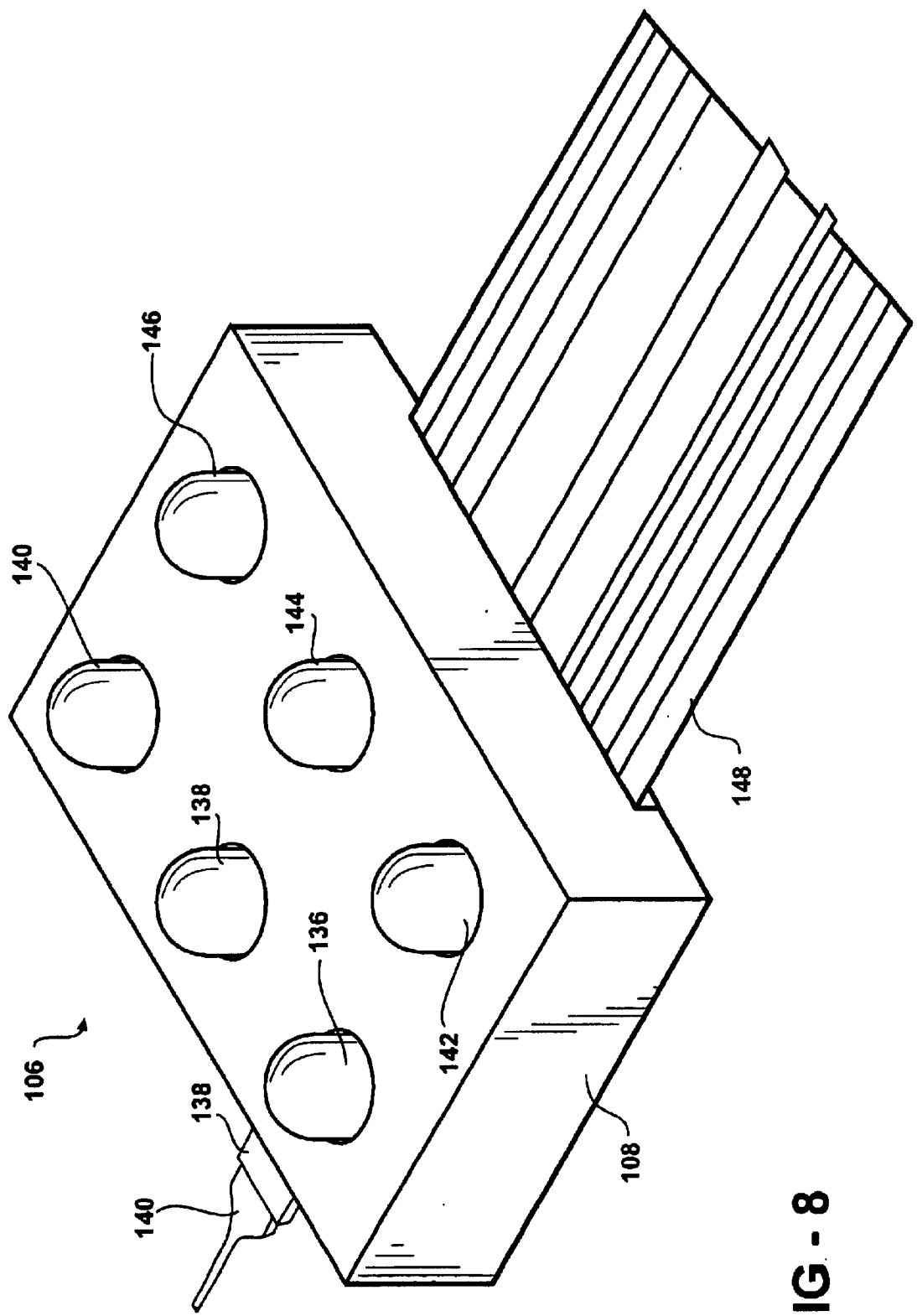
FIG. 8 is an assembled view of the embodiment of FIG. 7.

Referring now to FIGS. 7 and 8, a further preferred embodiment of the low current transfer electrical contact system is illustrated at 106 and includes a three dimensionally shaped tray having an assembleable base 108 and lid 110. A plurality of apertures, see at 112, 114, 116, 118, 120, and 122, and defined through a top face of the base 108 of the assembleable tray. As in the tray 10 described in the first preferred embodiment, a plurality of electrical contact lines (typically two apiece) extend to and from each of the individual spaced apertures. In particular, pairs of contact lines 124, 126, 128, 130, 132 and 134 are provided for each associated aperture bussed electrical contact 136, such as which again includes an input 138 extending from a selected edge of the assembled tray and which may be engaged by an appropriately configured input connector 140.

The first electrical contacts according to this embodiment include a further defined plurality of substantially three dimensionally shaped puck inserts, see at 136, 138, 140, 142, 144 and 146, respectively for being received within associated apertures 112, 114, 116, 118, 120 and 120 defined in the assembleable tray. The puck inserts 136–146, as best illustrated in the exploded view of FIG. 7, each are configured in substantially cylindrical fashion and include an annular extending ledge (see for example at 148 for puck 136). It is also contemplated that contact points (see pair at 150 again in FIG. 7 and in relation to selected puck 136) may be defined in relation to the selected puck and so that, upon assembly of the pucks within the tray, the low current is permitted to communicate from the tray through the pucks.

The second electrical contacts further comprising a substantially thin, planar shaped and flexible circuit sheet 148. The flex sheet 148 is as substantially described in the earlier preferred embodiments and includes a plurality of spaced apart contact locations, see at 150, 152, 154, 156, 158 and 160 which, upon assembly of the tray and puck inserts in the fashion further illustrated in FIG. 8, causes the bottom extending portions of each puck insert 136–146 to abuttingly contact the selected (second) electrical contact locations 150–160 of the flex sheet and in order for the low current input to be transferred to the flex sheet and then through that sheets solder patterns to its subsequent applications.

Figure 9:
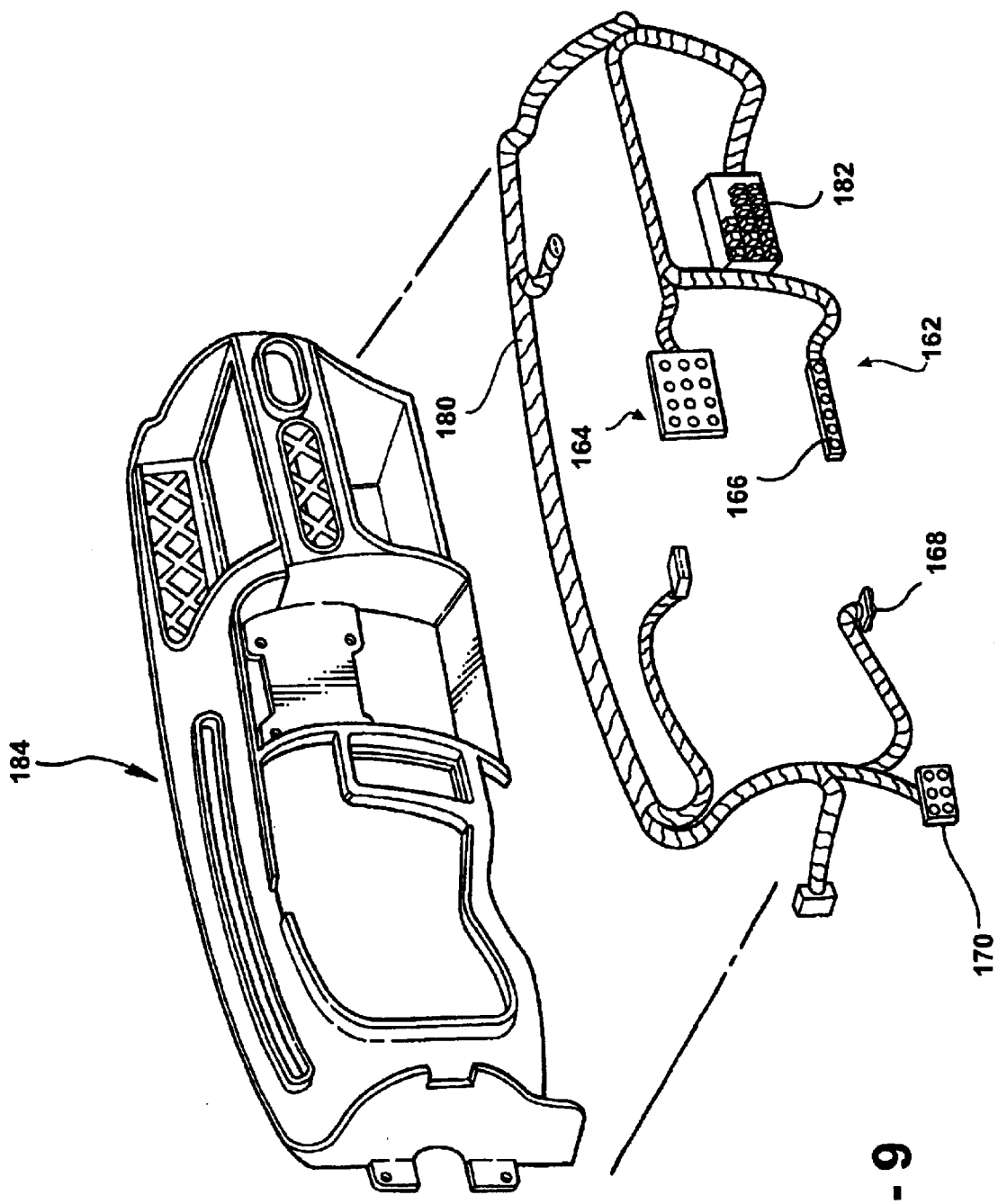
FIG. 9 is a partially exploded view of an electrical harness and junction box assembly for use with a vehicle instrument panel structural architecture and incorporating the low current minimal alignment compression contact system according to the first preferred embodiment of the present invention.

Referring now finally to FIG. 9, a final environmental application 162 is illustrated of a plurality of differently configured and individual low current contact systems, see at 164, 166, 168 and 170. These are incorporated into an electrical harness (see generally at 180) and junction box assembly 182 for use with a vehicle instrument panel structural architecture (see further generally at 184). The instrument panel architecture facilitates the installation of various components and subassemblies associated with the vehicle (not shown), such including HVAC plenum components, and as well as various types of low current demand assemblies, such as head lamps, steering column controls, vehicle radio/GPS systems and HVAC controls. The connections to such as these assemblies is again effectuated through the provision of the contact systems as shown in the several embodiments described previously and as again generically represented at 164, 166, 168 and 170.

Having described the presently preferred embodiments, it is to be understood that the invention may be otherwise embodied within the scope of the appended claims.

What is claimed is:

1. An electrical contact system, comprising:
   an elastomeric conductive material having a specified shape and size, said elastomeric conductive material exhibiting at least one first electrical contact location;
   an electrical power supply connected to said conductive material and communicable with said at least one first electrical contact location; and
   at least one second electrical contact arranged in abutting and substantially two dimensional contact with respect to said at least one first electrical contact location, an electrically communicable conduit extending from said second contact;
   said two dimensional electrical communication established between said abutting first and second contacts allowing for a range of misalignment existing therebetween.

2. The electrical contact system as described in claim 1, said elastomeric conductive material further comprising a substantially planar shaped tray, said at least one first electrical contact location further comprising a plurality of disk shaped portions projecting in spaced apart fashion from a selected face of said planar shaped tray.

3. The electrical contact system as described in claim 2, said at least one second electrical contact further comprising a further plurality of substantially disk shaped portions established in two dimensional contact with said associated first electrical contacts.

4. The electrical contact system as described in claim 2, said at least one second electrical contact further comprising a metallic rivet head portion.

5. The electrical contact system as described in claim 2, each of said disk shaped portions further comprising an inwardly extending recess visible from a further selected face of said planar shaped tray.

6. The electrical contact system as described in claim 2, said at least one second electrical contact further comprising a substantially thin, planar shaped and flexible circuit sheet, said flex circuit sheet including a plurality of spaced apart contact locations which abuttingly contact said associated disk shaped portions associated with said planar shaped tray.

7. The electrical contact system as described in claim 1, said elastomeric conductive material further comprising a three dimensionally shaped tray having an assembleable base and lid, a plurality of apertures being defined in a selected face of said assembleable tray.

8. The electrical contact system as described in claim 7, said at least one first electrical contact location further comprising a plurality of substantially three dimensionally shaped puck insert, each being received within an associated aperture defined in said assembleable tray.

9. The electrical contact system as described in claim 8, said at least one second electrical contact further comprising a substantially thin, planar shaped and flexible circuit sheet, said flex circuit sheet including a plurality of spaced apart contact locations which abuttingly contact said associated puck shaped inserts.

10. The electrical contact system as described in claim 1, said at least one second electrical contact further comprising a substantially three dimensionally shaped puck insert.

11. The electrical contact system as described in claim 10, said conductive material further comprising a three dimensional shaped body, said at least one first electrical contact further comprising at least one spaced apart recess defined within a selected face of said body and receiving, in inserting fashion, said puck shaped insert.

12. The electrical contact system as described in claim 11, said at least one second electrical contact further comprising a substantially thin, planar shaped and flexible circuit sheet, said flex circuit sheet including at least one spaced apart contact locations which is abuttingly contacted said associated puck shaped insert.

13. The electrical contact system as described in claim 1, said elastomeric conductive material further comprising at least one of a conductive plastic, silicone, and rubberized material.

14. An electrical contact system, comprising:

an elastomeric conductive material constructed as a substantially planar shaped tray;

a plurality of first electrical contact locations associated with a selected face of said tray and further comprising a plurality of disk shaped portions projecting in spaced apart fashion;

an electrical power supply connected to said conductive material and communicable with said first electrical contact locations; and a plurality of second electrical contacts arranged in abutting and substantially two dimensional contact with respect to said first electrical contact locations, an electrically communicable conduit extending from said second contact;

said two dimensional electrical communication established between said abutting first and second contacts allowing for a range of misalignment existing therebetween.

15. An electrical contact system, comprising:

an elastomeric conductive material constructed as a substantially planar shaped tray, a plurality of first electrical contact locations associated with a selected face of said tray and farther comprising a plurality of disk shaped portions projecting in spaced apart fashion;

an electrical power supply connected to said conductive material and communicable with said first electrical contact locations; and a plurality of second electrical contacts arranged in abutting and substantially two dimensional contact with respect to said first electrical contact locations, said second electrical contacts further comprising a substantially thin, planar shaped and flexible circuit sheet including a plurality of spaced apart contact locations which abuttingly contact associated first contacts;

said two dimensional electrical communication established between said abutting first and second contacts allowing for a range of misalignment existing therebetween.

* * * * *